United States Patent [19]

Richardson

[11] Patent Number: 5,574,360
[45] Date of Patent: Nov. 12, 1996

[54] SIMULTANEOUS SIGNAL DETECTOR

[75] Inventor: David L. Richardson, Arlington Heights, Ill.

[73] Assignee: Northrop Grumman Corporation, Los Angeles, Calif.

[21] Appl. No.: 439,677

[22] Filed: May 12, 1995

[51] Int. Cl.$^6$ ..................................................... G01R 23/16
[52] U.S. Cl. ........................... 324/76.39; 324/76.23
[58] Field of Search ................... 324/76.17, 76.21, 324/76.23, 76.24, 76.29, 76.39, 76.41, 76.42, 76.55, 76.57, 76.58, 76.82, 77.11, 98, 99 R

[56] References Cited

U.S. PATENT DOCUMENTS

| | | | |
|---|---|---|---|
| 3,699,442 | 10/1972 | Riley | 324/98 |
| 3,939,411 | 2/1976 | James | 324/77 |
| 4,231,018 | 10/1980 | Imigawa et al. | 324/76.57 |
| 4,336,541 | 6/1982 | Tsui et al. | 343/18 E |
| 4,426,648 | 1/1984 | Tsui et al. | 343/18 E |
| 4,504,786 | 3/1985 | Slaughter | 324/76.39 |
| 4,547,727 | 10/1985 | Tsui et al. | 324/79 D |
| 4,620,147 | 10/1986 | Niki | 324/76.15 |
| 4,633,516 | 12/1986 | Tsui | 455/226 |
| 4,791,360 | 12/1988 | Gagnon et al. | 324/78 D |
| 4,963,816 | 10/1990 | Tsui et al. | 324/77 H |
| 5,168,215 | 12/1992 | Puzzo | 324/78 F |
| 5,436,556 | 7/1995 | Komninos | 324/76.23 |

OTHER PUBLICATIONS

W. B. Sullivan "Extended Resolution TOA Measurement in an IFM Receiver," Applied Microwave & Wireless.

*Primary Examiner*—Michael Tokar
*Attorney, Agent, or Firm*—Terry J. Anderson; Karl J. Hoch, Jr.

[57] ABSTRACT

A simultaneous signal detector includes components for scaling, by the total signal strength, the difference signal resulting when signals having different frequencies are simultaneously received. As a result, only those inputs which meet both frequency and amplitude difference criteria result in an active SS indication, thereby reducing the number of false active and inactive indications.

17 Claims, 4 Drawing Sheets

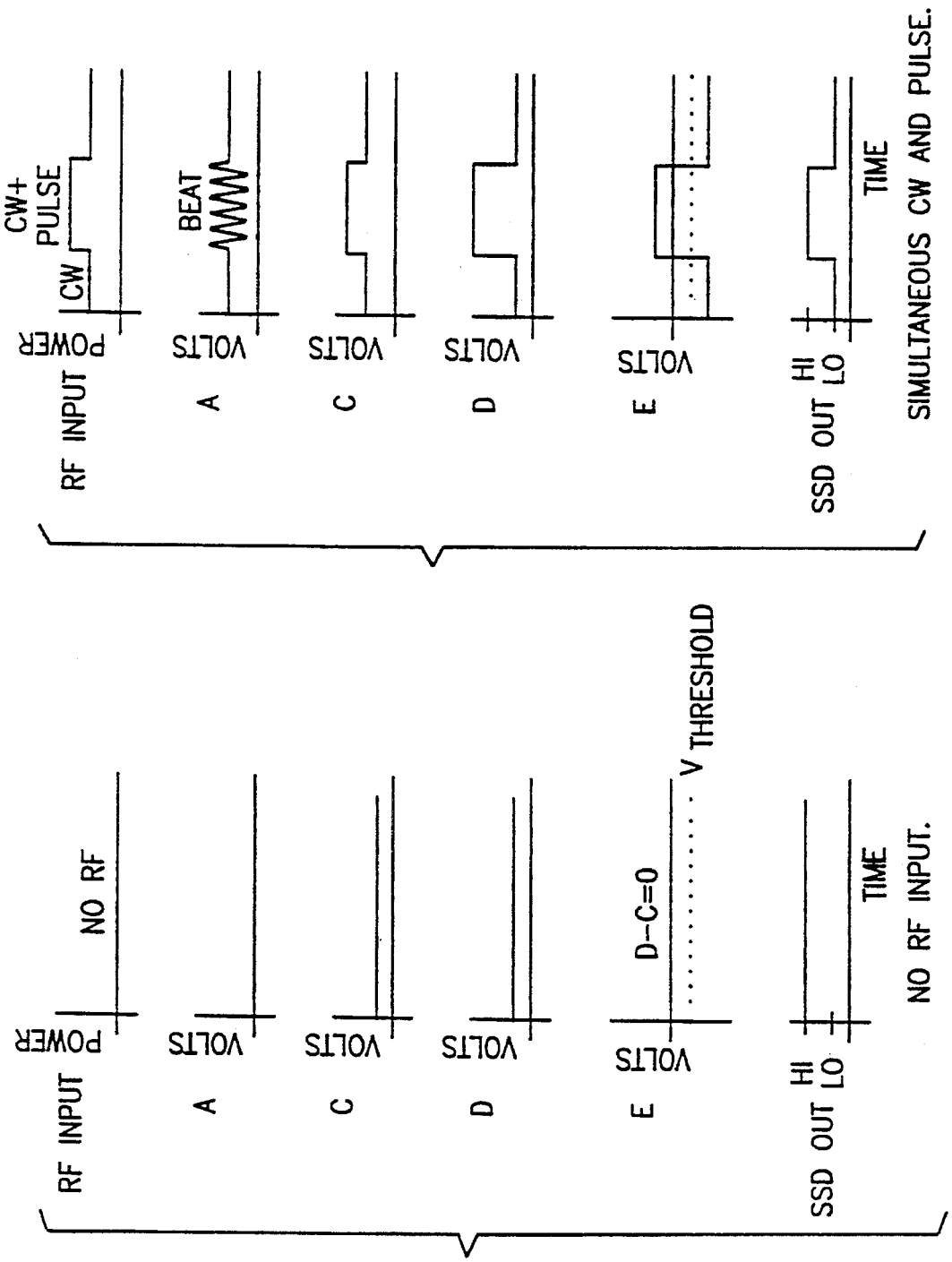

SIMULTANEOUS SIGNAL DETECTOR

BACKGROUND OF THE INVENTION

1. Field of the Invention

This invention relates to an improved simultaneous signal detector (SSD) circuit.

2. Description of Related Art

A simultaneous signal detector (SSD) circuit is used to detect the simultaneous or overlapping arrival of two separate signals. Simultaneous signal detectors are used in a variety of different applications, including both continuous wave and pulse radar receivers in order to recognize the second signal and permit the data represented by the second signal to be rejected or otherwise accounted for. In the instantaneous frequency measurement (IFM) module of a radio frequency (RF) radar receiver, for example, an active SSD signal means that the frequency data is invalid. An IFM module which includes a simultaneous signal detector is described, for example, in the article entitled "Microwave Receivers and Related Components," by James Tsui, Avionics Laboratory, Air Force Wright Aeronautical Laboratories, 1983.

Additional background on IFMs and SSDs is found in U.S. Pat. Nos. 4,633,516, 4,791,360, 4,963,816, 5,168,215, 4,426,648, 4,336,541, and 4,547,727. the first three of these patents discuss IFMs which do not include simultaneous signal detectors, the fourth listed patent discloses an SSD in combination with a signal strength detector, but in which the SSD output is not scaled by the signal strength (scaling is an important feature of the present invention, as discussed below), and the last three patents in the list disclose SSDs in which the difference signal is gated, as opposed to scaled, by the signal strength (these two patents are discussed in more detail below).

A typical simultaneous signal detector of the type used in an instantaneous frequency measurement module is shown in FIG. 5. In this detector, the input signal is separated into sum and difference signals by a square law detector 1, filter by a bandpass filter system 2 to reject the sum signal and any direct current signals, and sampled by a second detector 3, illustrated as a log detector, which outputs the difference signal to a first input of a comparison circuit 4, the second input of comparator 4 being a threshold voltage. The threshold is adjusted to cause an active output response from the comparator when the RF input signals are separated by a predetermined amplitude of, for example, from 0 to 6 dB. The comparator output is in binary from, with an active output marking a simultaneous signal (SS) condition, and an inactive output indicating a non-SS condition.

In the case of an instantaneous frequency detection module, the SSD output is usually combined with the output from the IFM in post processing. When an SS indication occurs, the post processing may, for example, mark the active SS-tagged IFM value as erroneous, and discard it from the evaluation. The system may then add signal processing elements in the RF path preceding the SSD/IFM such as tuned filters, to eliminate the SS condition, so as to improve the next IFM reading.

The conventional simultaneous signal detector, can only recognize signals with predetermined frequency separation criteria. An ideal output for a simultaneous signal detector would, in contrast, take into account the strength of the signals as follows:

1. The ideal SSD output is high (active) for:
   a. no RF input,
   b. weak inputs, defined as signals that are not significantly above circuit and thermal noise, and
   c. two simultaneous input signals with large input levels, where the input levels are "nearly identical" and the separation frequency of the simultaneous input signals is more than $F_{BEAT\ MIN}$ and less than $F_{BEAT\ MAX}$. Typically, "nearly identical" refers to a difference of 6 dB or less;
2. The ideal SSD output is low (inactive) for:
   a. one input signal with significantly large input power,
   b. two simultaneous inputs whose frequency separation is less than $F_{BEAT\ MIN}$ or greater than $F_{BEAT\ MAX}$,
   c. two simultaneous inputs where one signal is much stronger (typically, 6 dB or more) than the other.

Table 1, in which "X" is a true active indication and "-" is a true inactive SS indication, graphically illustrates the ideal simultaneous signal detector output:

TABLE 1

| SIGNAL 1 | SIGNAL 2 AMPLITUDE | | | |
|---|---|---|---|---|
| | None | Weak | Medium | Strong |
| None | X | X | — | — |
| Weak | X | X | — | — |
| Medium | — | — | X | — |
| Strong | — | — | — | X |

Because the conventional SSD cannot take into account the respective strengths of the input signals, it is impossible to set an adequate threshold which properly takes into account all situations, and thus suffers the following disadvantages:

1. When the threshold is set too high, the detector has the highest number of false negative indications, but correctly indicates the greatest number of legitimate non-SS conditions. This is illustrated in Table 2, in which "$error_{13}$ N" is a false inactive SSD indication:

TABLE 2

| | None | Weak | Medium | Strong |
|---|---|---|---|---|
| None | Error N | Error N | — | — |
| Weak | Error N | Error N | — | — |
| Medium | —  | — | Error N | — |
| Strong | — | — | — | X |

2. When the threshold is set too low, the conventional SSD has the highest number of false positive indications, but correctly indicates all legitimate SS conditions. This is illustrated in Table 3, in which $ERROR_{13}$ P represents a false inactive SS indication:

TABLE 3

| | Signal 1 None | Weak | Medium | Strong |
|---|---|---|---|---|
| None | X | X | — | — |
| Weak | X | X | Error P | — |
| Medium | — | Error P | X | Error P |
| Strong | — | — | Error P | X |

In general, in the type of conventional simultaneous signal detector exemplified by the detector illustrated in FIG. 5, there can be no single threshold setting in the prior art that is free of error. As will be explained in detail below, in order to solve this problem, the invention introduces a fitting parameter according to which the difference signal provided by the conventional detector illustrated in FIG. 1 is scaled before being input to the output comparator. In a preferred embodiment, the scaling parameter is the total input signal strength, which allows the preferred detector to take into account amplitude as well as frequency difference criteria.

This is in contrast to certain prior detectors, such as those disclosed in U.S. Pat. Nos. 4,336,541, 4,547,727, and 4,426,648, in which simultaneous signal detectors are described which gate the difference signal by a signal strength indicator (see FIG. 6, at 17 and FIG. 3, at 38, of the respective patents). As those skilled in the art will appreciate, gating is not equivalent to true scaling as is provided by the present invention, and the detectors disclosed in these patents will therefore not provide the advantages of the present invention.

SUMMARY OF THE INVENTION

It is a first objective of the invention to provide a simultaneous signal detector for detecting the simultaneous or overlapping arrival of two signals of differing frequencies f1 and f2, which gives a low number of false positive and negative indications, but correctly indicates all legitimate SS and non-simultaneous signal (SS) conditions, by scaling the difference signal f1–f2 and setting the threshold accordingly.

It is a further objective of the invention to provide a simultaneous signal detector which outputs an active SS indication only when the simultaneously arriving input signals meet both frequency and amplitude difference criteria, thereby reducing the number of false active and inactive indications, while increasing the number of legitimate SS and non-SS conditions.

This objective is accomplished by combining the difference signal with a signal representative of a parameter which is also indicative of the presence of multiple signals, but which is independent of the difference signal. In a preferred embodiment of the invention, the parameter used to scale the difference signal is the total signal strength of the incoming signal, which is processed in parallel with the difference signal and combined, after conversion to decibels, in a subtractor circuit.

BRIEF DESCRIPTION OF THE DRAWINGS

FIG. 4A illustrates the circuit response of the detector of FIG. 1, for the situation of no RF input.

FIG. 4B illustrates the response of the detector of FIG. 1 for the situation in which a continuous wave and pulse are received simultaneously.

DETAILED DESCRIPTION OF THE PREFERRED EMBODIMENTS

Figure 1:
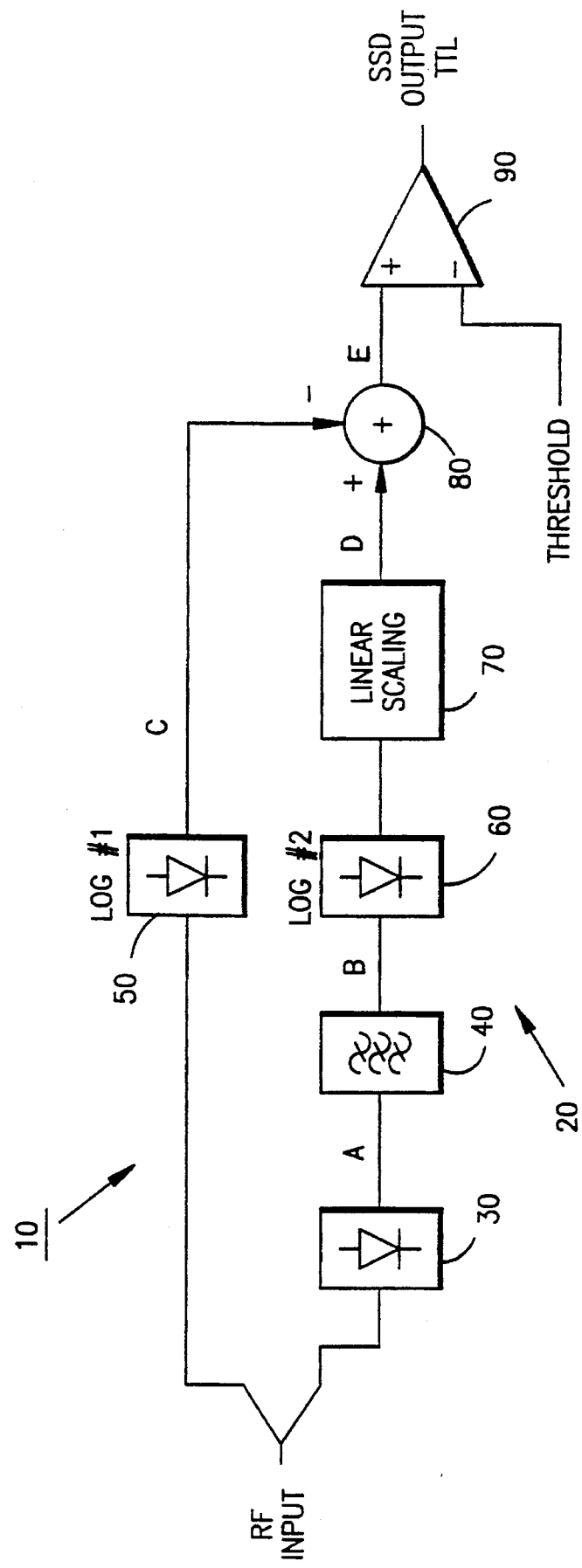
FIG. 1 is a block diagram showing a simultaneous signal detector according to a preferred embodiment of the invention.

FIG. 1 is a functional block diagram showing the principal components of an improved simultaneous signal detector constructed according to the principles of a preferred embodiment of the invention.

Initially, those skilled in the art should understand that the improvement provided by the invention, in its most general form, lies not in the specific circuitry of individual components of the illustrated detector, but in the general concept of scaling the difference signal by a fitting parameter, and more particularly in the concept of scaling the difference signal by the total signal strength, in what may otherwise be a conventional simultaneous signal detector. Details of the individual components, including square law detector 30, bandpass filter 40, log detectors 50 and 60, linear scaling circuit 70, subtractor circuit 80 and comparator 90 are well within the skill of the ordinary artisan, and consequently are not described in detail herein.

The basic approach of the illustrated embodiment is to split the input into separate paths 10 and 20, one of which generates a difference signal in conventional manner while the other detects the total power of the input signal in order to generate a fitting parameter which is then used to normalize or scale the difference signal before thresholding.

The input signal is made of a single signal having a frequency f1, or two signals f1 and f2, which can further be in either pulse or continuous wave form. After splitting, the input signal is separated into sum $\{(f1+f1)$ or $(f1+f2)\}$ and difference $\{(f1-f1)$ or $(f1-f2)\}$ signals by a square law detector 30 which schematically illustrated as a diode detector, but could also be in the form of an analog or digital multiplier, or a mixer. The sum signal and DC (f1–f1) signal (if present) are then rejected by a bandpass or equivalent filter 40 having set points defined by $0<|(f1-f2)|<(f1+f2)$, as a result of which only the difference signal $P=(f1-f2)$ remains.

Figure 5:
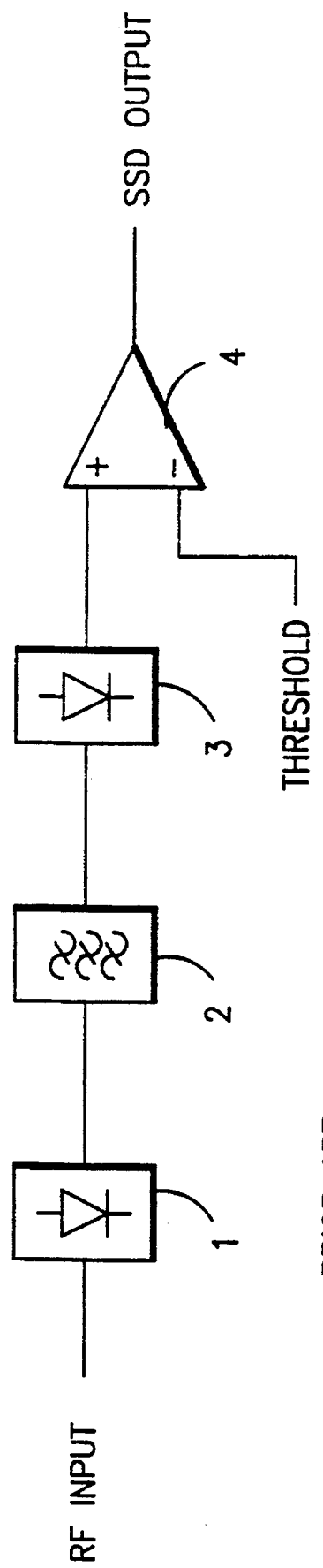
FIG. 5 is a block diagram of a conventional simultaneous signal detector.

At this point, in the conventional detector shown in FIG. 5, the difference signal P would be thresholded to determine whether f1 and f2 are sufficiently different to constitute two separate signals. However, the mere presence of a simultaneous signal should not cause an active SS indication, unless the signal also meets the amplitude criteria of FIG. 3. A scaling factor is used for qualifying the SS indication with amplitude. The scaling factor can be any parameter characteristic of two overlapping signals which is independent of the frequency difference, and in this case is chosen to be the total signal strength, since the amplitude of two overlapping signals will be the sum of the amplitudes of the individual signals. Those skilled in the art should appreciate, however, that the illustrated elements 50, 70–80 which accomplish the task of scaling the difference signal by the total signal strength constitute just one of many suitable combinations, and that it is intended that the scope of the invention include all such alternative combinations. Furthermore, it is within the intended scope of the invention to add additional scaling factors before generating the final output.

In the preferred embodiment, both the difference signal P and the total signal strength Q are transformed into logarithms by first and second log detectors 50 and 60, located in the respective parallel processing paths 10 and 20, before combination to obtain the result log(f(x)). The purpose of including log detectors at this point is to decrease the bandwidth requirements of subsequent components, the output of the log detector being in the form of decibels, and also as a matter of convenience since the logarithm log(f(x) of the normalized difference signal f(x)=P/Q can be expressed as log(P)-log(Q), and thus a subtractor 80 can then be used to obtain the output. However, the log detectors could be omitted or included elsewhere in the detector, and thus the invention should not be limited to the inclusion of log detectors or any other signal compression components.

After isolation of the difference signal P by bandpass filter 40, and conversion to logarithmic form by the second log detector 60, the difference signal is preferably passed through a gain adjustment circuit 70 for the purpose of adjusting for the difference in path gain between log detectors 50 and 60, and in particular for the gain of the square law detector 30. Log detectors 50 and 60 are both illustrated as diode detectors, although other types of log detector may also be substituted, while those skilled in the art will appreciate that circuit 30 is simply a signal amplitude detector, such as a linear detector, a square law detector, a log detector, a coherent mixer, or a sampling circuit followed by more advanced digital signal processing circuitry, depending on the specific application to which the simultaneous signal detector is to be applied.

The final element in the preferred simultaneous signal detector is a thresholding circuit, illustrated as a comparator 90. The first input of comparator 90 is connected to receive the output of gain adjustment circuit 70, while the second input of the comparator is a threshold voltage. The threshold is adjusted to cause an active output response from the comparator when the RF input signals are separated by a predetermined amplitude of from 0 to 6 dB. The comparator output is in binary form, with an active output marking an SS condition, and an inactive output indicating a non-SS condition. Although illustrated as a simple comparator, those skilled in the art will appreciate that more sophisticated thresholding circuitry may be substitute, allowing additional inputs as appropriate.

Figure 2:
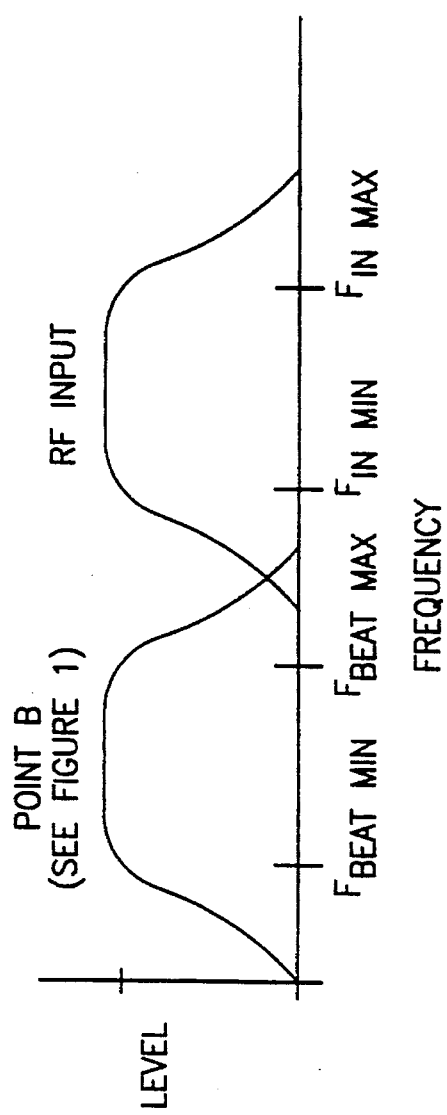
FIG. 2 is a graph showing the frequency range of the detector FIG. 1.

In practice, as illustrated in FIG. 2 (in which the frequency range for the RF input is defined as being between $F_{IN\ MIN}$ and $F_{IN\ MAX}$ and the frequency separation between two simultaneous RF input signals, or beat frequency, is defined as being between $F_{BEAT\ MIN}$ and $F_{BEAT\ MAX}$), the minimum separation resolvable by the simultaneous signal detector of the invention is not zero, and in many applications is preferred to be at least one MHz. Those skilled in the art will appreciate that the simultaneous signal detector cannot resolve signals which are spaced closer than the minimum beat frequency $F_{BEAT\ MIN}$ MHZ and that the minimum beat frequency also significantly affects the response time. In addition, the maximum frequency separation, $F_{BEAT\ MAX}$, is limited by the output capability of the linear detector and by whether the log detector 50, to which the total signal strength is applied, is a full- or half-wave detector. A full-wave detector has a higher maximum frequency in this application than a half-wave log detector. The maximum frequency separation in FIG. 2 appears to be less than the minimum input frequency, but with a full-wave log detector, $F_{BEAT\ MAX} > F_{IN\ MIN}$ is possible. By controlling the minimum and maximum beat frequencies, the response of the detector can be adjusted to minimize the number of false active SS or non-SS signals.

Figure 3:
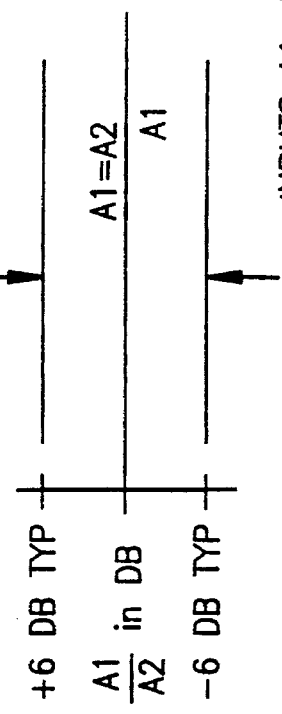
FIG. 3 is a graph illustrating the relative amplitude range of the detector FIG. 1.

Also, in practice, because it is necessary in the preferred simultaneous signal detector for simultaneous input signals to be close in amplitude, signals of significantly different amplitude can be ignored. As shown in FIG. 3, the range of signals which will cause an SS indication is typically between +6 and −6 decibels due to the sensitivity of the detector to the amplitude relationship between simultaneous signals.

As a result of the principles illustrated in FIGS. 2 and 3, the preferred simultaneous signal detector has the following "ideal" characteristics:

1. The SSD output is high (active) for:
   a. no RF input,
   b. weak inputs, defined as signals that are not significantly above circuit and thermal noise, and
   c. two simultaneous input signals with large input powers, where the input levels are "nearly identical" and the separation frequency of the simultaneous input signals is more than $F_{BEAT\ MIN}$ and less than $F_{BEAT\ MAX}$. Typically, "nearly identical" refers to a difference of 6 dB or less;
2. The SSD output is low (inactive) for:
   a. one input signal with significantly large input power,
   b. two simultaneous inputs whose frequency separation is less than $F_{BEAT\ MIN}$ or greater than $F_{BEAT\ MAX}$,
   c. two simultaneous inputs where one signal is much stronger (typically, 6 dB or more) than the other.

Typical circuit responses for the invention are shown in FIG. 4. In FIG. 4A, there is no RF input, and therefore the output of the square law detector 30 (point A) is equal to the noise floor of the diode, the scaling factor output by the log detector 60 is equal to the noise floor of the detector 60 (point C), the output of the log detector 60 and linear scaling circuit 70 is low (point D), and the scaled output of the subtractor circuit 80 is above the threshold, causing the SSD output from comparator 90, to be high (active).

FIG. 4B shows simultaneous continuous wave (CW) and pulse RF inputs which meet the frequency and amplitude criteria. When only the CW input is present, the signal level at point C is below point D, and the output of the subtractor circuit 80 is thus below the threshold, causing an inactive SS indication to be output by comparator 90. On the other hand, when both the CW input and the pulse input are present, the scaling factor output by log detector 60 at point C increases with the amplitude of the combined signal, the difference signal at point D increases with the difference in frequencies, and the output of the subtractor circuit at point E rises above the threshold if either the scaling factor or difference signal are sufficiently large, at which time comparator 90 outputs an SS active indication.

Having thus described a preferred embodiment of the invention in sufficient detail to enable those skilled in the art to make and use the invention, it will nevertheless be appreciated that numerous variations and modifications of the preferred embodiment are possible within the scope of the invention, and therefore the invention should not be limited by the above description. For example, those skilled in the art will appreciate that while the preferred simultaneous signal detector is illustrated as having two RF inputs, the principles of the invention are also applicable to a simultaneous signal detector having three or more input RF signals. Furthermore, as indicated above, the preferred simultaneous signal detector is applicable to both pulse and CW inputs, which can be either deterministic or noise-like, and can be used over a wide operating range, particularly if the illustrated log detectors are utilized, although those skilled in the art will appreciate that the log detectors are an advantageous but not necessarily essential feature of the invention. Accordingly, it is intended that the invention not be limited by the above description and accompanying illustrations of the preferred embodiment of the invention, but rather that the invention be limited solely in accordance with the appended claims.

I claim:

1. In a simultaneous signal detector for indicating the simultaneous presence of an RF input signal made up of signals having frequencies f1 and f2 separated by a predetermined minimum, including:

a difference signal generating component which includes means for generating and outputting a difference signal proportional to the difference P between frequencies f1 and f2; and a simultaneous signal (SS) active signal generating component which includes means for evaluating an output of the first component to determine whether the input signal is made up of separate signals, and generating an SS active signal in response to detection of the separate signals;

the improvement comprising:

a splitter having an input connected to the RF input of the detector and two outputs, one of which is connected to an input of the first component, the two outputs forming two parallel processing paths;

a first detector including means for detecting a parameter of the input signal which is independent of the difference in frequencies and which is to be used as a scaling factor for the difference signal, said first detector having as an input a second output of the splitter;

a difference signal scaling component having as inputs respective outputs of the first detector and the difference signal generating component, and including means for scaling the respective outputs of the first detector and the difference signal generating component and outputting a result of the scaling to the input of the evaluating component.

2. A simultaneous signal detector as claimed in claim 1, wherein said first detector includes means for detecting a total signal strength of the input signal, whereby the signal output by the SS active signal generating component outputs an active SS indication only when the separate SS signals meet predetermined frequency and amplitude separation criteria.

3. A simultaneous signal detector as claimed in claim 2, wherein said difference signal generating component includes means for generating a logarithm of the difference signal P, said first detector includes means for generating a logarithm of the total signal strength Q, and the combining component includes means generating a normalized difference signal by subtracting logQ from logP.

4. A simultaneous signal detector as claimed in claim 3, wherein the difference signal generating means includes a square law detector connected to an output of the splitter for separating the input signal into the difference signal and a sum signal, and a filter for separating the difference signal from the sum signal.

5. A simultaneous signal detector as claimed in claim 4, wherein the filter is a bandpass filter for rejecting the sum signal and a DC component of the difference signal.

6. A simultaneous signal detector as claimed in claim 5, wherein the means for generating the difference signal further comprising a linear scaling circuit including means for accounting for differences in gain between the two paths before combination of the signals in the respective paths by the difference signal scaling component.

7. A simultaneous signal detector as claimed in claim 6, wherein the SS active signal generating component is a comparator having as one input an output of the subtractor and as a second input a threshold signal, the result being a binary TTL output in which a high level indicates the presence of simultaneous signals and the low level indicates the absence of simultaneous signals.

8. A simultaneous signal detector as claimed in claim 5, wherein the SS active signal generating component is a comparator having as one input an output of the subtractor and as a second input a threshold signal, the result being a binary TTL output in which a high level indicates the presence of simultaneous signals and the low level indicates the absence of simultaneous signals.

9. A simultaneous signal detector as claimed in claim 4, wherein the SS active signal generating component is a comparator having as one input an output of the subtractor and as a second input a threshold signal, the result being a binary TTL output in which a high level indicates the presence of simultaneous signals and the low level indicates the absence of simultaneous signals.

10. A simultaneous signal detector as claimed in claim 4, wherein the means for generating the difference signal further comprising a linear scaling circuit including means for accounting for differences in gain between the two paths before combination of the signals in the respective paths by the difference signal scaling component.

11. A simultaneous signal detector as claimed in claim 3, wherein the SS active signal generating component is a comparator having as one input an output of the subtractor and as a second input a threshold signal, the result being a binary TTL output in which a high level indicates the presence of simultaneous signals and the low level indicates the absence of simultaneous signals.

12. A simultaneous signal detector as claimed in claim 3, wherein the means for generating the difference signal further comprising a linear scaling circuit including means for accounting for differences in gain between the two paths before combination of the signals in the respective paths by the difference signal scaling component.

13. A simultaneous signal detector as claimed in claim 3, wherein the filter is a bandpass filter for rejecting the sum signal and a DC component of the difference signal.

14. A simultaneous signal detector as claimed in claim 2, wherein the SS active signal generating component is a comparator having as one input an output of the subtractor and as a second input a threshold signal, the result being a binary TTL output in which a high level indicates the presence of simultaneous signals and the low level indicates the absence of simultaneous signals.

15. A simultaneous signal detector as claimed in claim 2, wherein the means for generating the difference signal further comprising a linear scaling circuit including means for accounting for differences in gain between the two paths before combination of the signals in the respective paths by the difference signal scaling component.

16. A simultaneous signal detector as claimed in claim 2, wherein the filter is a bandpass filter for rejecting the sum signal and a DC component of the difference signal.

17. A simultaneous signal detector as claimed in claim 2, wherein the difference signal generating means includes a square law detector connected to an output of the splitter for separating the input signal into the difference signal and a sum signal, and a filter for separating the difference signal from the sum signal.

* * * * *